US009425064B2

(12) United States Patent
Thambidurai et al.

(10) Patent No.: US 9,425,064 B2
(45) Date of Patent: Aug. 23, 2016

(54) LOW-COST LOW-PROFILE SOLDER BUMP PROCESS FOR ENABLING ULTRA-THIN WAFER-LEVEL PACKAGING (WLP) PACKAGES

(71) Applicant: Maxim Integrated Products, Inc., San Jose, CA (US)

(72) Inventors: Karthik Thambidurai, Plano, TX (US); Viren Khandekar, Flower Mound, TX (US); Tiao Zhou, Carrollton, TX (US)

(*) Notice: Subject to any disclaimer, the term of this patent is extended or adjusted under 35 U.S.C. 154(b) by 95 days.

(21) Appl. No.: 13/718,130

(22) Filed: Dec. 18, 2012

(65) Prior Publication Data

US 2014/0167252 A1    Jun. 19, 2014

(51) Int. Cl.
*H01L 21/48* (2006.01)
*H01L 23/488* (2006.01)
*H01L 23/00* (2006.01)

(52) U.S. Cl.
CPC ......... *H01L 21/4814* (2013.01); *H01L 23/488* (2013.01); *H01L 24/11* (2013.01); *H01L 24/743* (2013.01); *H01L 24/93* (2013.01); *H01L 24/94* (2013.01); *H01L 24/03* (2013.01); *H01L 24/05* (2013.01); *H01L 24/13* (2013.01); *H01L 2224/0381* (2013.01); *H01L 2224/03828* (2013.01); *H01L 2224/0401* (2013.01); *H01L 2224/05073* (2013.01); *H01L 2224/05082* (2013.01); *H01L 2224/05147* (2013.01); *H01L 2224/05155* (2013.01); *H01L 2224/05644* (2013.01); *H01L 2224/05647* (2013.01); *H01L 2224/1181* (2013.01); *H01L 2224/1183* (2013.01); *H01L 2224/11422* (2013.01); *H01L 2224/131* (2013.01); *H01L 2224/13111* (2013.01); *H01L 2224/16225* (2013.01); *H01L 2224/93* (2013.01); *H01L 2224/94* (2013.01); *H01L 2924/12042* (2013.01)

(58) Field of Classification Search
None
See application file for complete search history.

(56) References Cited

U.S. PATENT DOCUMENTS

| 4,763,829 | A | * | 8/1988 | Sherry | H01L 24/81 228/124.1 |
| 5,071,058 | A | * | 12/1991 | Nowotarski | B23K 1/20 228/219 |
| 5,827,951 | A | * | 10/1998 | Yost | B23K 31/02 228/103 |
| 5,944,250 | A | * | 8/1999 | Zagalskiy | 228/207 |
| 6,134,918 | A | * | 10/2000 | Eto | G11B 5/8404 65/30.14 |
| 2004/0072416 | A1 | * | 4/2004 | Fay | C23F 1/34 438/614 |
| 2006/0043154 | A1 | * | 3/2006 | Kirby | B23K 1/0016 228/37 |
| 2008/0244900 | A1 | * | 10/2008 | Maeda | B23K 35/0244 29/840 |

* cited by examiner

*Primary Examiner* — Steven Loke
*Assistant Examiner* — Juanita Rhodes
(74) *Attorney, Agent, or Firm* — Advent, LLP

(57) ABSTRACT

Techniques are described herein for a dip soldering process which provides a low-profile, low-cost solder bump formation process which may be implemented to promote package thickness scaling (e.g., reduce the overall package thickness). For example, the dip soldering process disclosed herein may enable ultra-thin wafer-level packages (WLP), ultra-thin wafer level quad-flat no-leads (WQFN) packages, or the like.

15 Claims, 4 Drawing Sheets

US 9,425,064 B2

LOW-COST LOW-PROFILE SOLDER BUMP PROCESS FOR ENABLING ULTRA-THIN WAFER-LEVEL PACKAGING (WLP) PACKAGES

BACKGROUND

In semiconductor packaging, methods such as electroplating or ball placement are used to form solder bumps for board attachment on wafer-level. Both of these methods/processes involve: a) designing a mask or stencils; and b) use of photo or alignment tools to: align the mask or stencil properly to the under-bump metallization (UBM); deposit or place balls on the UBM; and reflow to form the bumps.

SUMMARY

Techniques are described for a dip soldering process which provides a low-profile, low-cost solder bump formation process which may be implemented to enable ultra-thin wafer-level packages (WLP), ultra-thin wafer level quad-flat no-leads (WQFN) packages, or the like.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Two primary methods used in semiconductor packaging for the formation of solder bumps for board attachment are electroplating and ball placement. Both of these methods/processes involve: a) designing a mask or stencils; and b) use of expensive photo or alignment tools to: align the mask or stencil properly to the under-bump metallization (UBM); deposit or place balls on the UBM; and reflow to form the bumps. Thus, the above-referenced methods/processes are expensive and time consuming. As the bump profile gets smaller, use of these methods becomes even more costly. Further, when using these methods, handling of wafers, particularly, thin wafers, becomes challenging when attempting to form a very thin package thickness.

Portable electronics have driven the need for thickness scaling of a wafer-level packaging (WLP) package. Previously, package thickness has been reduced (e.g., from 0.64 millimeters (mm) to 0.35 mm) by reducing the ball height through the use of micro-ball placement. However, there are significant challenges to further thickness scaling, such as micro-ball placement capability limits (e.g., currently at 80 micrometers (um) per minute (min)) and the significant cost impact (e.g., micro-ball placement increases the processing cost for each wafer tenfold).

Disclosed herein are solder bump formation processes which: a) provide low-profile, low-cost solder bump formation to enable further package thickness scaling (e.g., reduce the overall package thickness) compared to currently used solder bump formation processes; and b.) can be implemented at a fraction of the cost of currently used solder bump formation processes, such as ball placement or plating.

Example Systems

Figure 1:
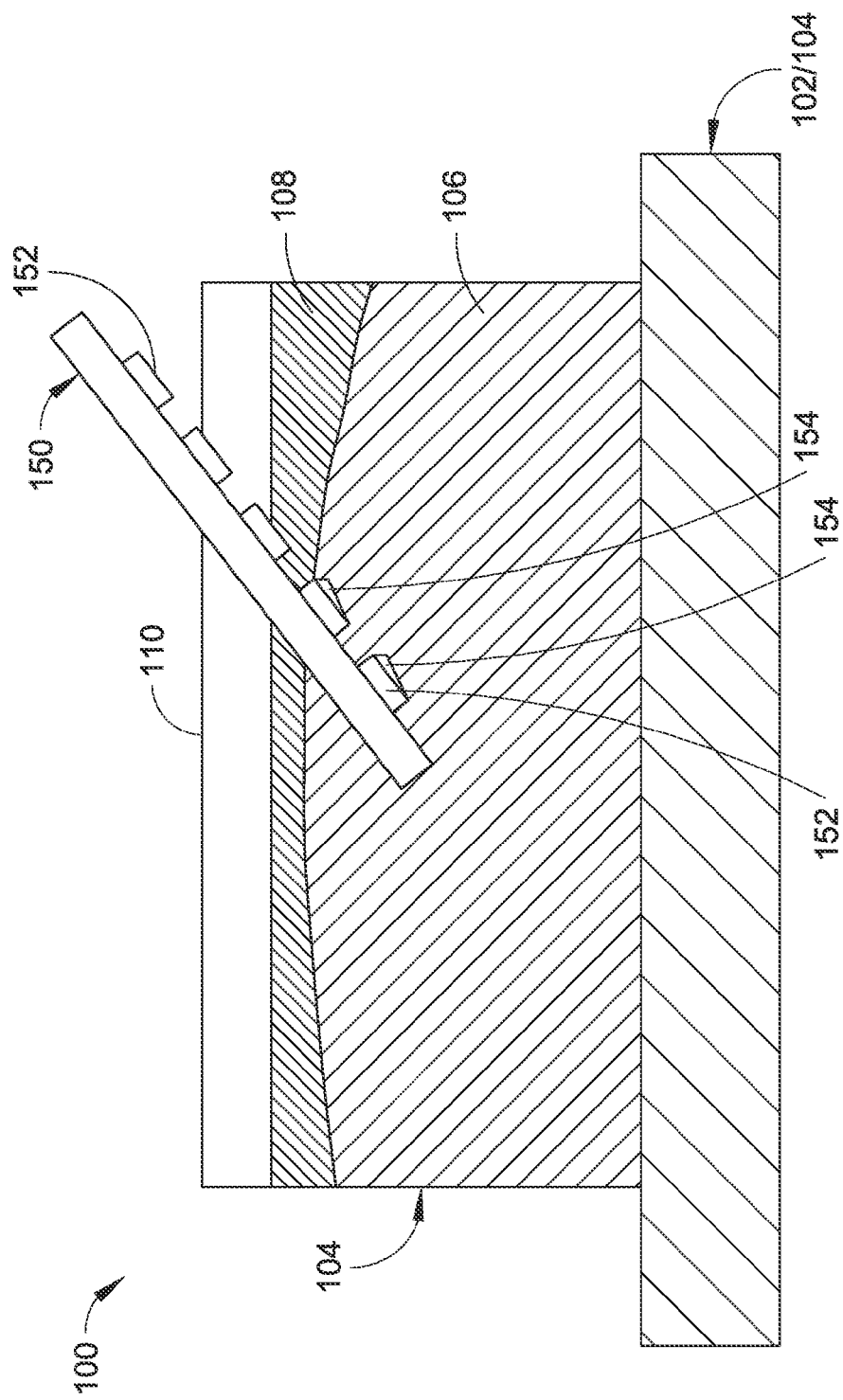
FIG. 1 is a diagram of a system which can be implemented for performing solder bump formation process in accordance with an exemplary embodiment of the present disclosure.
Figure 2:
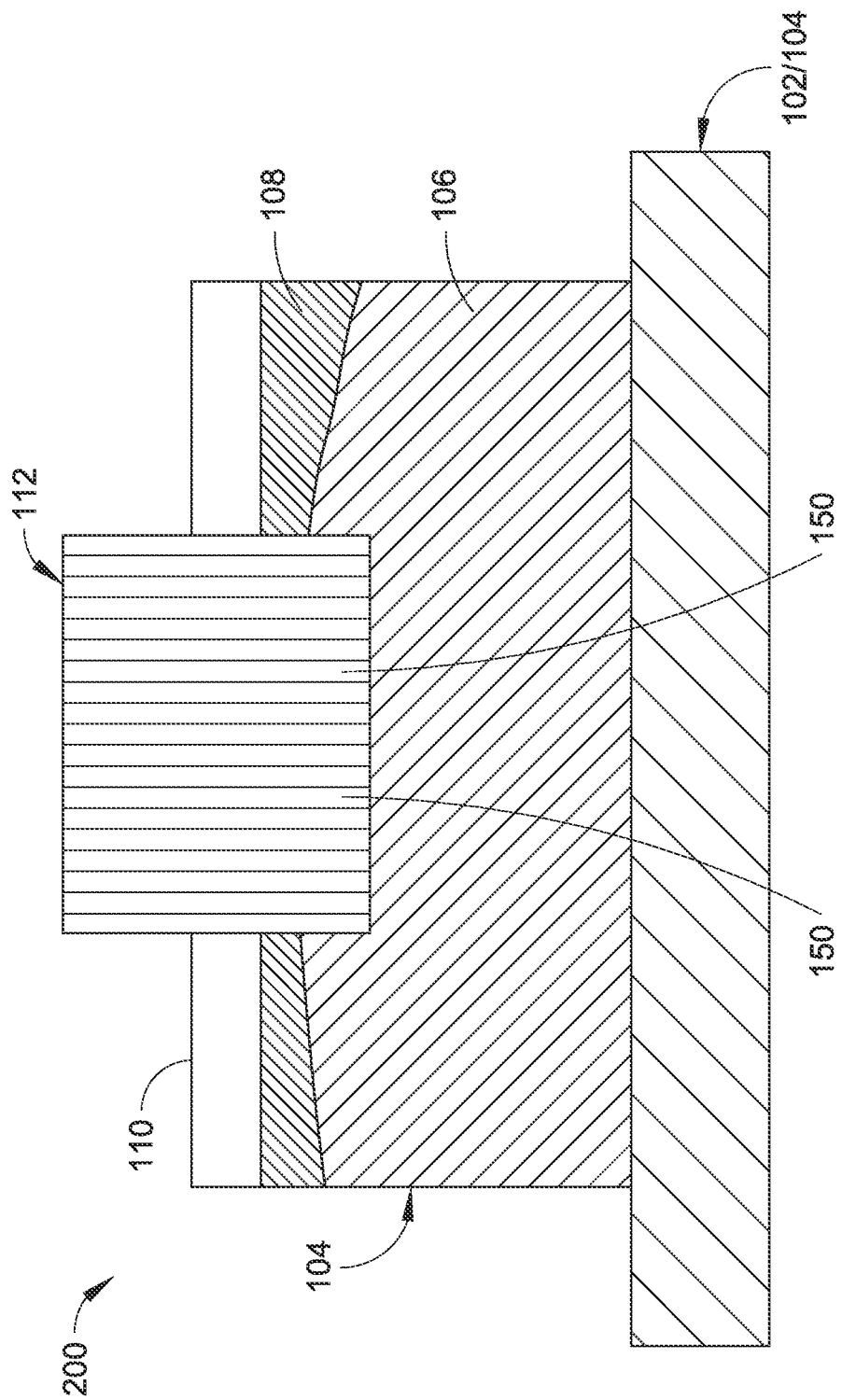
FIG. 2 is a diagram of a system which can be implemented for performing a solder bump formation process in accordance with a further exemplary embodiment of the present disclosure.

FIGS. 1 and 2 illustrate systems (100, 200) which may be implemented for performing the process 300 for forming solder bumps on a wafer 150 (the process 300 is described in detail below). In embodiments, the wafer 150 (as shown in FIG. 1) is a fully-formed wafer (e.g., a silicon wafer) with an underbump metallurgy (UBM) 152 (e.g., a copper (Cu) UBM, a nickel (Ni)/gold (Au) UBM, a Cu/electroless nickel immersion gold (ENIG) UBM, or any finish) of a specific size and shape. In embodiments, the UBM 152 is a photo-defined UBM.

In FIG. 1, a system 100 configured for performing the process 300 on one wafer at a time is shown in accordance with an exemplary embodiment of the present disclosure. The system 100 includes a heating element 102, such as a hot plate. Further, the system 100 includes a receptacle 104, such as a tank or pot, which is connected to (e.g., configured upon) the heating element 102. The receptacle 104 is constructed for holding (e.g., containing) solder (e.g., molten solder) 106. For example, the solder 106 may be placed into the receptacle 104 and heated, via the heating element 102, to a temperature (e.g., 230 degrees Celsius) at which the solder is molten solder 106, thereby allowing the receptacle 104 to provide a molten solder bath. In embodiments, the molten solder 106 may be any solder type, such as tin (Sn). The receptacle 104 is further configured for holding (e.g., containing) flux 108 (e.g., wafer-bumping flux), such as a water-soluble flux, a no-clean flux, a non-activated rosin flux (R flux), a mildly-activated rosin flux (RMA flux), or an activated rosin flux (RA flux). In embodiments, the flux 108 may be a liquid, a foam, or a paste. The flux 108 may be configured for attacking (e.g., preventing) oxidation and/or contaminants on a surface (e.g., UBM 152) of the wafer 150, thereby making the surface active.

In embodiments, within the receptacle 104, the flux 108 is located above (e.g., is layered on top of) the solder 106, as shown in FIG. 1. In embodiments, the receptacle 104 is sized for holding (e.g., containing) the wafer 150. In embodiments, the receptacle 104 has an open end 110 which is configured (e.g., sized) for receiving (e.g., allowing entry of) the wafer 150 into the receptacle 104, so that the wafer 150 may be dipped (e.g., lowered) into the flux 108 and then dipped into the molten solder 106. The receptacle 104 is further configured (e.g., sized) so that the wafer 150 may then be removed (e.g., withdrawn) from the receptacle 104, after the wafer 150 has been dipped into the flux 108 and molten solder 106. In embodiments, the wafer 150 may be dipped into and/or removed from the flux 108 and molten solder 106 at an angle relative to a top surface of the flux 108 and/or a top surface of the solder 106, such as an angle ranging from approximately 20 degrees to approximately 70 degrees. In other embodiments, the wafer 150 may dipped straight down into the and/or lifted straight up out of the flux 108 and solder 106, such as at a 90 degree angle relative to the top surface of the flux 108 and/or a top surface of the solder 106. In embodiments, the system 100 may be configured for allowing a user to manually introduce the wafer 150 into and remove the wafer 150 from the receptacle. Alternatively, the system 100 may be automated, such that the wafer 150 is introduced into and removed from the receptacle via automated equipment. Further, the automated system may monitor and/or control process conditions, such as an amount of time the wafer 150 is exposed to the flux 108 and/or the molten solder 106, the temperature of the molten solder 106, etc.

In FIG. 2, a system 200 configured for performing the process 300 for multiple wafers concurrently (e.g., simultaneously) is shown in accordance with an exemplary embodiment of the present disclosure. In embodiments, the system 200 includes a heating element (e.g., hot plate) 102, such as described above. Further, the system 200 includes a receptacle 104 configured for containing flux 108 and molten solder 106, such as described above. Further, the receptacle 104 includes an open end 110, such as described above. However, in the system 200 shown in FIG. 2, the receptacle 104 is sized for receiving a holder 112 (e.g., a cassette) which is configured for holding (e.g., containing) a plurality of wafers 150. For example, the system 200 allows for the holder 112 and the multiple wafers 150 contained within the holder 112 to be introduced into (e.g., received within) the receptacle 104 concurrently (e.g., simultaneously), so that both the holder 112 and the wafers 150 contained within the holder 112 may be dipped into the flux 108, then dipped into the molten solder 106, then removed (e.g., withdrawn) from the receptacle. In embodiments, the holder 112 is configured for allowing the wafers 150 to come into physical contact with the flux 108 and the molten solder 106 while the wafers 150 are contained within the holder 112. Thus, system 200 allows for batch processing of the wafers 150. In embodiments, in the system 200 shown in FIG. 2, the holder 112 and/or the wafers 150 may be dipped into and/or removed from the flux 108 and molten solder 106 at an angle relative to a top surface of the flux 108 and/or a top surface of the solder 106, such as an angle ranging from approximately 20 degrees to approximately 70 degrees. In other embodiments, the holder 112 and/or the wafers 150 may dipped straight down into the and/or lifted straight up out of the flux 108 and solder 106, such as at a 90 degree angle relative to the top surface of the flux 108 and/or a top surface of the solder 106. Similar to system 100 described above, in embodiments, system 200 may be configured as a manual system or an automated system.

In other system embodiments, an existing printed circuit board (PCB) wave soldering system may be implemented, such that the wafer(s) may be passed through a fountain or wave of molten solder, for introducing the wafer into the solder. In such system embodiments, automation may be implemented and introduction of the wafer to the flux and the solder may be performed at separate stations, such as a fluxing station and a molten solder station. For example, a typical sequence using such system embodiments may involve the following steps being performed: a) an operator places the wafer on a chuck; b) the chuck and wafer are moved to the fluxing station for the wafer to be fluxed fully on its UBM side; c) the wafer is moved to the molten solder station (e.g., the molten solder chamber) and passed through the solder fountain, where the solder reacts and forms a fillet on the UBM.

Example Solder Bump Formation Processes

Figure 3:
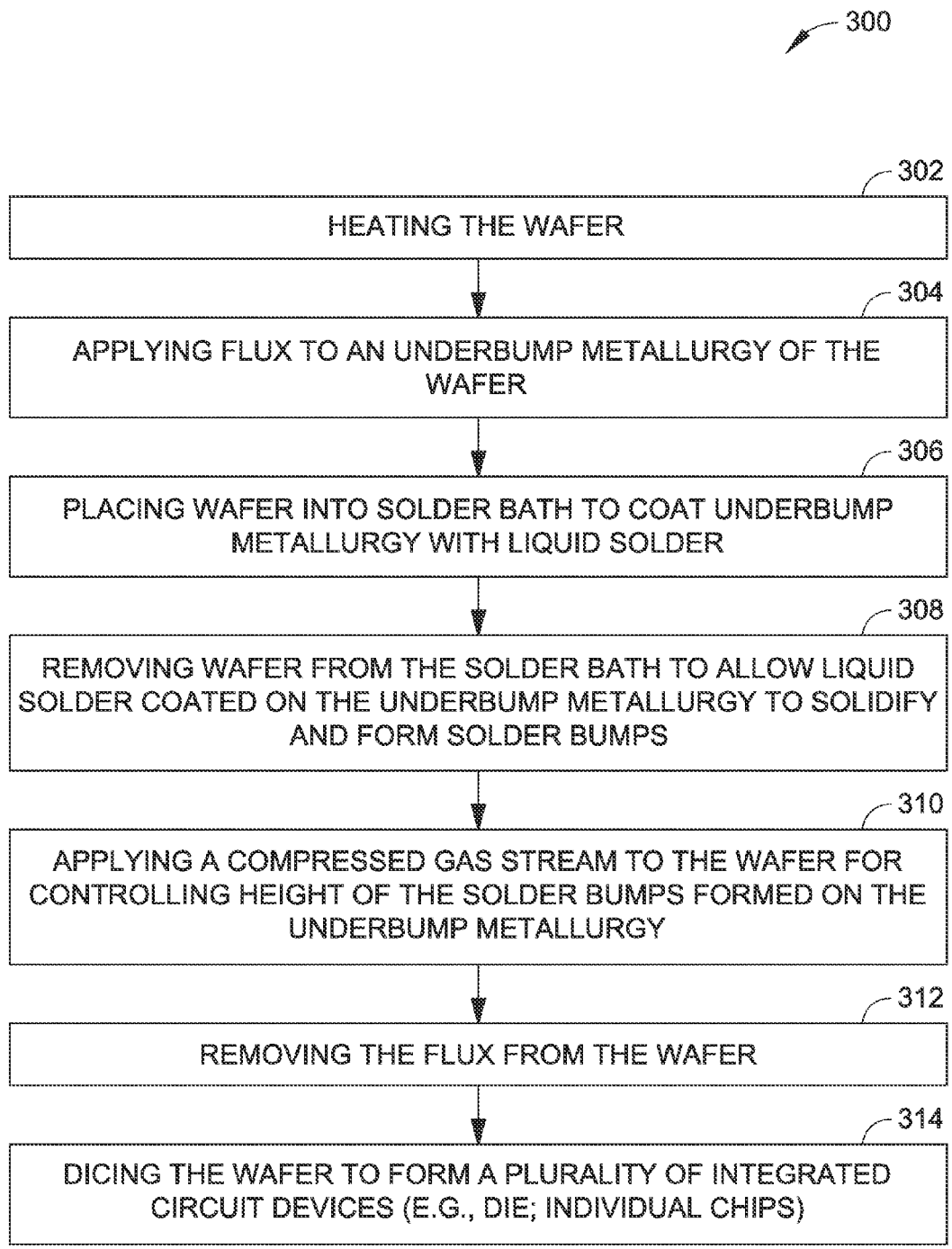
FIG. 3 is a flow diagram illustrating a process for performing solder bump formation on an underbump metallurgy (UBM) of a wafer in accordance with an exemplary embodiment of the present disclosure.

FIG. 3 illustrates a process 300 (e.g., a dip soldering process) for forming solder bumps (e.g., low-profile solder bumps) on a wafer (e.g., on wafer level) in accordance with an exemplary embodiment of the present disclosure. In embodiments, the wafer 150 (as shown in FIG. 1) is a fully-formed wafer (e.g., a silicon wafer). For example, the wafer 150 is formed of semiconductor material (e.g., silicon) and may have one or more integrated circuits formed therein. In various implementations, the integrated circuits may be digital integrated circuits, analog integrated circuits, mixed signal integrated circuits, combinations thereof, and so forth. The integrated circuits may be formed through suitable front-end-of-line (FEOL) fabrication techniques. In embodiments, the wafer 150 includes an underbump metallurgy (UBM) 152 (e.g., a copper (Cu) UBM, a nickel (Ni)/gold (Au) UBM, a Cu/electroless nickel immersion gold (ENIG) UBM, or any finish) of a specific size and shape. In embodiments, the UBM 152 is a photodefined UBM.

In embodiments, the process 300 includes a step of applying flux to an underbump metallurgy of the wafer (Step 304) (e.g., fluxing the wafer, coating the wafer with flux). For example, the wafer 150 may be directed (e.g., dipped, lowered) into a flux 108 (e.g., wafer-bumping flux), such as a water-soluble flux, a no-clean flux, a non-activated rosin flux (R flux), a mildly-activated rosin flux (RMA flux), or an activated rosin flux (RA flux). In embodiments, the flux 108 may be a liquid, a foam, or a paste. The flux 108 may be configured for attacking (e.g., preventing) oxidation and/or contaminants on a surface (e.g., UBM 152) of the wafer 150, thereby making the surface active.

In embodiments, the process 300 further includes a step of placing the wafer into a solder bath to coat the underbump metallurgy with liquid solder (Step 306). For instance, after the wafer 150 is dipped into the flux 108, the wafer 150 may be directed (e.g., dipped) into a bath of molten solder 106. For example, the solder bath may include 20 liters (lits) of liquid (e.g., molten) solder, the molten solder being at a temperature of at least 230 degrees Celsius. In embodiments, the molten solder 106 may be any solder type, such as tin (Sn) solder. When the wafer 150 is exposed to the molten solder 106, the UBM 152 has a solid-state reaction with the solder 106, which causes an intermetallic compound to form at an interface of the UBM 152. This intermetallic compound causes the interface of the UBM 152 to be a wettable surface configured for holding the solder 106, due to surface tension.

In embodiments, the process 300 further includes a step of removing the wafer from the solder bath to allow the liquid solder coated on the underbump metallurgy to solidify and form a solder bump on the underbump metallurgy (Step 308). For example, after the wafer 150 is exposed to (e.g., dipped into) the molten solder 106, the wafer 150 is slowly removed from (e.g., slowly pulled out of) the solder bath. During and after the time that the wafer 150 is being slowly removed from the solder bath, the solder 106 that holds onto (e.g., adheres to) the UBM 152 solidifies and forms a solder bump 154, leaving a nice protective solder finish. The formed solder bump 154 may be configured as a dome-shaped solder fillet formed on the UBM 152 (e.g., formed on a pad of the UBM, such as a copper (Cu) pad). In embodiments, the height of the formed solder bump 154 ranges from 1 to 100 micrometers (um) depending on the geometry (e.g., surface area of the copper pad) of the UBM 152 and/or surface tension. In an exemplary embodiment, the height (e.g., thickness) of the formed solder bump 154 ranges from 20 to 40 micrometers (um) for providing approximately a 50% height reduction as compared to solder bumps formed by prior processes. In embodiments, the height of the formed solder bump (e.g., solder fillet) 154 may be controlled by: using a gas knife (e.g., a device for delivering compressed gas (e.g., air, nitrogen) onto or along a surface of the UBM 152, such as a nitrogen gas jet); controlling the dipping parameters; and/or adjusting the geometry of the UBM 152 by design.

In embodiments, the process 300 further includes a step of, prior to applying flux to the wafer, heating the wafer (Step 302). For example, prior to coating the wafer with flux (Step 304) and prior to placing the wafer into a solder bath (Step 306), the wafer 150 may be pre-heated (Step 302) in order to minimize (e.g., prevent) the possibility of breakage of the wafer 150 when it is later placed in the molten solder 106. In embodiments, the wafer 150 may be heated to a temperature that is 20-30 degrees Celsius below the melting point of the solder. For instance, in embodiments, the wafer 150 may be heated to a temperature of 150 degrees Celsius.

In embodiments, the process 300 further includes a step of, after removing the wafer from the solder bath, applying a compressed gas stream to the wafer for controlling a height of the solder bump formed on the underbump metallurgy (Step 310). In embodiments, the height of the formed solder bump (e.g., solder fillet) 154 may be controlled by using a gas knife (e.g., a device, such as a gas jet, configured for delivering compressed gas (e.g., compressed air, compressed nitrogen) onto or along a surface of the UBM 152. Further, the height of the formed solder bump 154 may also be controlled by controlling the dipping parameters and/or adjusting the geometry of the UBM 152 by design. In embodiments, compressed air or compressed nitrogen gas ($N_2$) can be applied as the wafer is pulled out of the solder bath to control the height of the solder bump before solidification of the solder.

In embodiments, the process 300 further includes a step of, after removing the wafer from the solder bath, removing the flux from the wafer (Step 312). For example, after being removed from the solder bath (Step 308), the wafer 150 may be treated with water or some solvent (e.g., 99% isopropyl alcohol) for removing the flux 108 from the wafer 150.

In embodiments, the process 300 further includes a step of dicing the wafer to form a plurality of integrated circuit devices (e.g., die; individual chips) (Step 314). Dicing of the wafer can be accomplished by scribing and breaking, by mechanical sawing, or by laser cutting. Following dicing, the individual chips (e.g., silicon chips) may be encapsulated into chip carriers which are then suitable for building electronic devices, such as computers, etc. The above-described process 300 may be implemented to enable ultra-thin wafer-level packages (WLP), ultra-thin wafer level quad-flat no-leads (WQFN) packages, etc.

Figure 4:
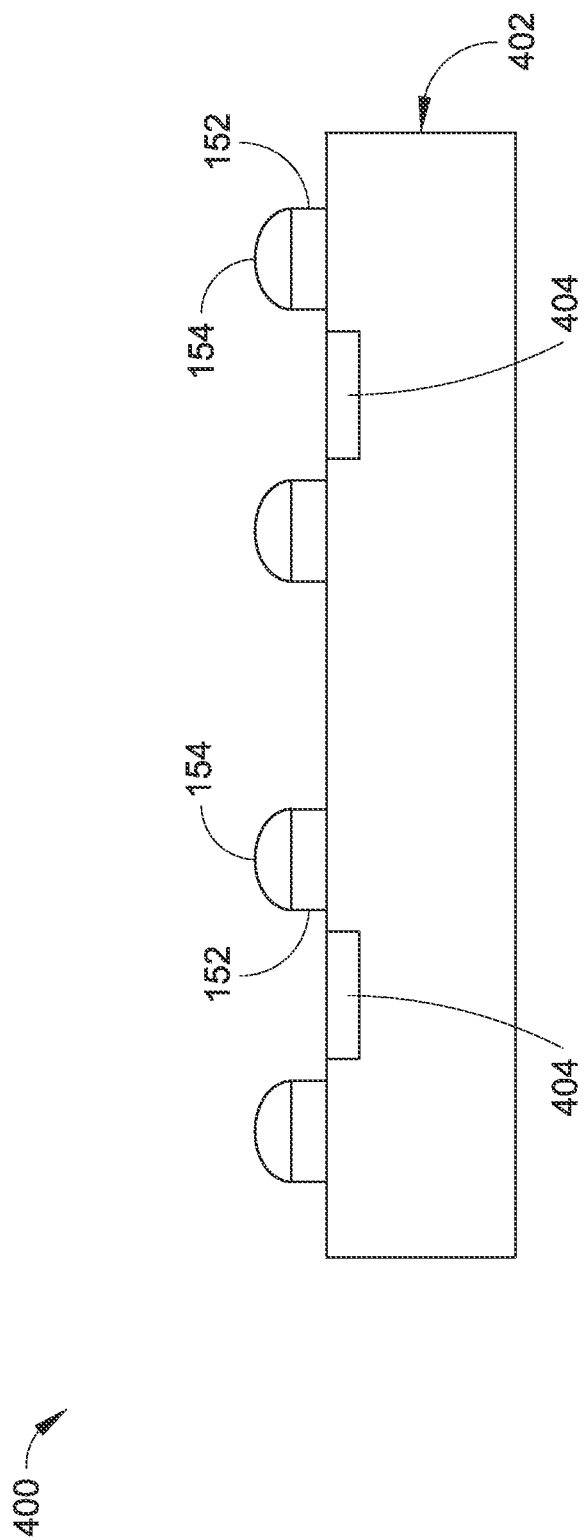
FIG. 4 is a view of an integrated circuit device (e.g., chip) having solder bumps formed by the process illustrated in FIG. 3, in accordance with an exemplary embodiment of the present disclosure.

FIG. 4 illustrates an integrated circuit device (e.g., individual chip) 400 formed by the process 300 described above. In implementations, the integrated circuit device 400 may be a digital integrated circuit device, an analog integrated circuit device, a mixed-signal integrated circuit device, and so forth. In embodiments, the integrated circuit device 400 includes a semiconductor substrate (e.g., silicon substrate) 402 having one or more integrated circuits 404 formed therein. In various implementations, the integrated circuits 404 may be digital integrated circuits, analog integrated circuits, mixed signal integrated circuits, combinations thereof, and so forth. The integrated circuits 404 may be formed through suitable front-end-of-line (FEOL) fabrication techniques.

In embodiments, the integrated circuit device (e.g., chip) 400 formed by the process 300 described above includes underbump metallurgy 152 and solder bump(s) 154 formed on the underbump metallurgy 152. Each solder bump 154 may have a height ranging from 1 micrometer to 100 micrometers. For example, the solder bump 154 may have a height between 5 and 50 micrometers, between 20 and 40 micrometers, etc. In embodiments, the solder bumps 154 and underbump metallurgy 152 serve to provide electrical interconnections between the integrated circuit device (e.g., chip) 400 and a substrate (e.g., a printed circuit board) that is configured to receive the device 400. In embodiments, the integrated circuit device 400 formed by the process 300 of the present disclosure may be implemented in a variety of electronic (e.g., computing) devices, such as portable electronics (e.g., Smartphones, tablets).

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. A process comprising:
positioning a plurality of semiconductor wafers over a receptacle, the plurality of semiconductor wafers disposed within a holder configured to hold the plurality of semiconductor wafers in a vertically oriented configuration, the receptacle containing liquid solder, wherein a flux is disposed over the receptacle, each semiconductor wafer of the plurality of semiconductor wafers further comprising silicon;
prior to transitioning the plurality of semiconductor wafers through the flux and a solder bath, pre-heating respective semiconductor wafers of the plurality of semiconductor wafers to a temperature that is twenty to thirty degrees Celsius below a melting point of the liquid solder to minimize breakage of the respective semiconductor wafers of the plurality of semiconductor wafers;
transitioning the plurality of semiconductor wafers through the flux to apply the flux to an underbump metallurgy of respective semiconductor wafers of the plurality of semiconductor wafers;
transitioning the plurality of semiconductor wafers into the solder bath;
placing the plurality of semiconductor wafers into the receptacle to coat the underbump metallurgy with the liquid solder; and
removing the plurality of semiconductor wafers from the receptacle to allow the liquid solder coated on the underbump metallurgy to solidify and form a solder bump on the underbump metallurgy of the plurality of semiconductor wafers.

2. The process as claimed in claim 1, further comprising:
after removing the plurality of semiconductor wafers from the receptacle, removing the flux from the plurality of semiconductor wafers.

3. The process as claimed in claim 1, wherein the underbump metallurgy is photodefined and is formed of one of: copper, nickel, gold, and electroless nickel immersion gold.

4. The process as claimed in claim 1, wherein the flux is configured for inhibiting oxidation on a surface of the respective semiconductor wafers of the plurality of semiconductor wafers, the flux being one of: a water-soluble flux, a no-clean flux, and a rosin flux.

5. The process as claimed in claim 1, wherein the solder bump has a height ranging from 1 micrometer to 100 micrometers.

6. The process as claimed in claim 1, wherein the solder bump has a height ranging from 1 micrometer to 50 micrometers.

7. The process as claimed in claim 6, wherein the liquid solder in the solder bath is at a temperature of at least 230 degrees Celsius.

8. The process as claimed in claim 1, further comprising:
after removing the plurality of semiconductor wafers from the receptacle, applying a compressed gas stream to respective semiconductor wafers of the plurality of semiconductor wafers for controlling a height of the solder bump formed on the underbump metallurgy.

9. A process comprising:
pre-heating a plurality of silicon wafers to a temperature of one hundred and fifty degrees Celsius prior to transitioning the plurality of silicon wafers through a flux to minimize breakage of the plurality of silicon wafers, the plurality of silicon wafers disposed within a holder configured to hold the plurality of silicon wafers in a vertically oriented configuration;
positioning the plurality of silicon wafers over a receptacle, the receptacle containing liquid solder, wherein the flux is disposed over the receptacle;
transitioning the plurality of silicon wafers through the flux to apply the flux to an underbump metallurgy of the plurality of silicon wafers, the plurality of silicon wafers transitioned through the flux at an angle of ninety degrees (90°) relative to a surface of the flux, the flux being one of: a liquid, a foam, or a paste;
transitioning the plurality of silicon wafers through the flux into the receptacle to coat the underbump metallurgy with the liquid solder;
removing the plurality of silicon wafers from the receptacle to allow the liquid solder coated on the underbump metallurgy to solidify and form a solder bump on the underbump metallurgy; and
removing the flux from the plurality of silicon wafers.

10. The process as claimed in claim 9, wherein the flux is configured for inhibiting oxidation on a surface of the plurality of silicon wafers, the flux being one of: a water-soluble flux, a no-clean flux, and a rosin flux.

11. The process as claimed in claim 9, further comprising:
after removing the plurality of silicon wafers from a solder bath, applying a compressed gas stream to the plurality of silicon wafers for controlling a height of the solder bump formed on the underbump metallurgy, the compressed gas stream being one of: a compressed air stream and a compressed nitrogen stream.

12. The process as claimed in claim 9, wherein the solder bump has a height ranging from 1 micrometer to 100 micrometers.

13. The process as claimed in claim 12, wherein the solder bump has a height of 40 micrometers.

14. The process as claimed in claim 9, further comprising:
dicing respective silicon wafers of the plurality of silicon wafers to form a plurality of integrated circuit devices.

15. The process as claimed in claim 9, wherein the underbump metallurgy is photodefined and is formed of one of: copper, nickel, gold, and electroless nickel immersion gold.

* * * * *